(12) United States Patent
Jung et al.

(10) Patent No.: US 8,017,269 B2
(45) Date of Patent: Sep. 13, 2011

(54) ANODE ACTIVE MATERIAL, METHOD OF PREPARING THE SAME, AND ANODE AND LITHIUM BATTERY CONTAINING THE ANODE ACTIVE MATERIAL

(75) Inventors: In-sun Jung, Suwon-si (KR); Young-gyoon Ryu, Suwon-si (KR); Seok-soo Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1056 days.

(21) Appl. No.: 11/602,636

(22) Filed: Nov. 20, 2006

(65) Prior Publication Data

US 2007/0172732 A1    Jul. 26, 2007

(30) Foreign Application Priority Data

Jan. 20, 2006  (KR) .................. 10-2006-0006272

(51) Int. Cl.
*H01M 4/13*  (2010.01)
*H01M 4/58*  (2010.01)
*C23C 14/00*  (2010.01)

(52) U.S. Cl. ............ 429/218.1; 29/623.1; 204/192.15

(58) Field of Classification Search ........... 429/218.1, 429/231.95; 204/192.15
See application file for complete search history.

(56) References Cited

U.S. PATENT DOCUMENTS

| | | | |
|---|---|---|---|
| 6,887,511 B1 * | 5/2005 | Shima et al. ............... | 427/58 |
| 7,410,728 B1 | 8/2008 | Fujimoto et al. | |
| 7,476,469 B2 | 1/2009 | Ota et al. | |
| 2003/0039889 A1 * | 2/2003 | Park et al. ............... | 429/231.1 |
| 2004/0126659 A1 * | 7/2004 | Graetz et al. ............. | 429/218.1 |
| 2004/0197660 A1 * | 10/2004 | Sheem et al. ............ | 429/231.95 |
| 2006/0275668 A1 * | 12/2006 | Peres et al. .............. | 429/231.8 |

FOREIGN PATENT DOCUMENTS

| | | |
|---|---|---|
| CN | 1382310 A | 11/2002 |
| CN | 1222064 C | 10/2005 |
| JP | 2001-266851 | 9/2001 |
| JP | 2004-214055 | 7/2004 |
| JP | 2004-533699 | 11/2004 |
| JP | 2005-63772 | 3/2005 |
| JP | 2005-063772 | 3/2005 |
| JP | 2005-0637220 | 3/2005 |

(Continued)

OTHER PUBLICATIONS

Zi, et al., "Raman shifts in Si nanocrystals," Appl. Phys. Lett. 69 (2), Jul. 8, 1996, American Institute of Physics, pp. 200-202.

(Continued)

*Primary Examiner* — Barbara L Gilliam
*Assistant Examiner* — Stephan Essex
(74) *Attorney, Agent, or Firm* — Christie, Parker & Hale, LLP

(57) ABSTRACT

An anode active material is provided. The anode active material includes a silicon thin film containing crystalline silicon having a Raman shift in a Raman spectrum ranging from about 490 to about 500 cm$^{-1}$ and a full width at half maximum (FWHM) ranging from about 10 to about 30 cm$^{-1}$. The volume of the anode active material does not change significantly during charging and discharging. Thus, a lithium battery employing the anode active material has an excellent capacity retention rate and a longer cycle lifetime.

13 Claims, 7 Drawing Sheets

FOREIGN PATENT DOCUMENTS

| | | |
|---|---|---|
| JP | 2005-108774 | 4/2005 |
| KR | 2002-0042736 | 6/2002 |
| KR | 2002-0045616 | 6/2002 |
| KR | 2003-0066816 | 8/2003 |
| WO | WO 01/29913 A1 | 4/2001 |

OTHER PUBLICATIONS

Patent Abstracts of Japan, Publication No. 2005-063772, Published on Mar. 10, 2005, in the name of Inamasu, et al.
English abstract of WO 01/031721 dated May 3, 2001 corresponding to KR 2002-0045616 listed above.
Chinese Office action dated Feb. 27, 2009, for corresponding Chinese application 2006101494358, with English translation, noting Japan reference JP 2005-063772 previously filed in an IDS dated May 9, 2007.
Patent Abstracts of Japan, Publication No. 2005-063722, Published on Mar. 10, 2005, in the name of Yokoo, et al.
Japanese Office action dated Mar. 2, 2010, for corresponding Japanese application 2006-341855, noting listed references in this IDS.
SIPO Registration Determination Certificate dated May 19, 2010, for corresponding Chinese Patent application 200610149435.8, noting listed references in this IDS.
KIPO Notice of Allowance dated Aug. 23, 2010, for Korean priority Patent application 10-2006-0006272, noting listed references in this IDS, as well as KR 2002-0045616, previously filed in an IDS dated May 22, 2007.

* cited by examiner

ANODE ACTIVE MATERIAL, METHOD OF PREPARING THE SAME, AND ANODE AND LITHIUM BATTERY CONTAINING THE ANODE ACTIVE MATERIAL

CROSS-REFERENCE TO RELATED PATENT APPLICATION

This application claims priority to and the benefit of Korean Patent Application No. 10-2006-0006272, filed on Jan. 20, 2006 in the Korean Intellectual Property Office, the entire content of which is incorporated herein by reference.

BACKGROUND OF THE INVENTION

1. Field of the Invention

The present invention relates to anode active materials, methods of preparing the same, and anodes and lithium batteries containing the anode active materials. More particularly, the invention is directed to an anode active material including crystalline silicon which undergoes insignificant volume changes.

2. Description of the Related Art

Non-aqueous electrolyte secondary batteries, which include anodes comprising lithium compounds, exhibit high voltages and high energy densities, and have therefore been widely researched. Lithium metal has been studied as an anode material because of its high capacity. However, when metallic lithium is used as the anode material, lithium dendrites are deposited on the surface of the metallic lithium during charging. The lithium dendrites reduce the charge/discharge efficiency of the battery, and can cause short-circuits. Furthermore, lithium metal anodes can be unstable due to the high reactivity of lithium.

On the other hand, carbon-based anodes have decreased expansion and contraction volumes during charge/discharge cycles relative to anodes made of lithium or lithium alloys. However, carbon-based anodes have reduced capacity (about 350 mAh/g) and initial charge and discharge efficiency relative to lithium.

SUMMARY OF THE INVENTION

In one embodiment of the present invention, an anode active material includes a crystalline silicon thin film.

In another embodiment of the present invention, an anode includes the anode active material.

In yet another embodiment of the present invention, a lithium battery includes the anode active material.

In still another embodiment of the present invention, a method of preparing the anode active material is provided.

According to one embodiment of the present invention, an anode active material includes a silicon thin film that contains crystalline silicon having Raman shift in the Raman spectrum ranging from about 490 to about 500 $cm^{-1}$ and a full width at half maximum (FWHM) ranging from about 10 to about 30 $cm^{-1}$.

In one embodiment, the crystal size of the crystalline silicon in the anode active material is less than about 5 nm.

According to one embodiment of the present invention, the silicon thin film may be formed using radio frequency (RF) sputtering. In the RF-sputtering, the RF-power may range from about 30 to about 90 watts, and the operating pressure of the chamber may range from about 5 to about 20 mtorr.

In one embodiment of the present invention, the thickness of the crystalline silicon thin film may range from about 20 to about 500 nm.

According to another embodiment of the present invention, an anode includes the anode active material.

According to yet another embodiment of the present invention, a lithium battery employs the anode.

According to another embodiment of the present invention, a method of preparing an anode active material includes forming a crystalline silicon thin film on a substrate using RF-sputtering. In the RF-sputtering, the RF-power ranges from about 30 to about 90 watts, and the operating pressure of the chamber ranges from about 5 to about 20 mtorr.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

The present invention will now be described with reference to the accompanying drawings, in which exemplary embodiments of the invention are shown. The invention may, however, be embodied in many different forms and is not limited to the illustrated and described embodiments. Rather, the described embodiments are provided for illustrative purposes only.

According to one embodiment of the present invention, an active anode material comprises noncrystalline silicon or crystalline silicon, and includes a silicon thin film having a novel structure containing crystalline silicon. The volume of the anode active material does not change significantly, and thus a lithium battery employing the anode active material has an excellent capacity retention rate and longer cycle lifetime.

The anode active material according to this embodiment of the present invention includes a silicon thin film containing crystalline silicon having a Raman shift in a Raman spectrum ranging from about 490 to about 500 $cm^{-1}$ and a full width at half maximum (FWHM) ranging from about 10 to about 30 $cm^{-1}$.

The silicon thin film primarily comprises noncrystalline silicon, but has crystalline silicon partially distributed inside the silicon thin film. This structure shows a property in the Raman spectrum different from that of noncrystalline silicon in which a broad peak is observed in the Raman shift of around 480 cm$^{-1}$ and different from that of polycrystalline silicon in which a sharp peak is observed in the Raman shift of around 520 cm$^{-1}$.

Figure 1:
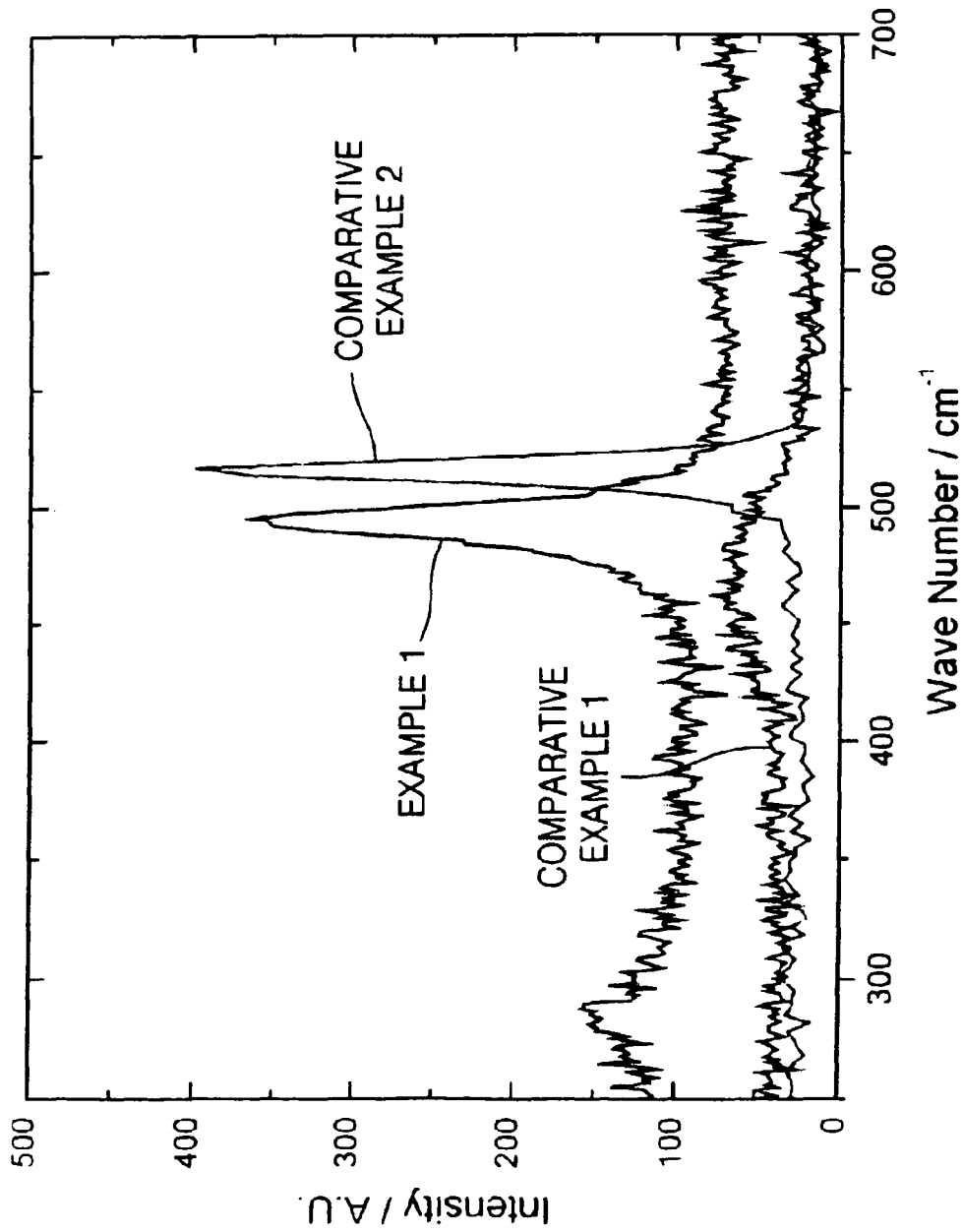
FIG. 1 is graph of the Raman spectra of silicon thin films prepared according to Example 1 and Comparative Examples 1 and 2.

The crystal size of the crystalline silicon that forms a part of the silicon thin film of the anode active material may be less than about 5 nm. In one embodiment, the crystal size ranges from about 0.1 to 4 nm. Debye-Scherrer rings (shown in FIGS. 2A and 2B) are observed in transmission electron microscope (TEM) images of crystalline materials. When the crystal size of the crystalline silicon is less than about 5 nm, the Debye-Scherrer rings cannot be observed. However, in the crystalline silicon according to this embodiment of the present invention, a sharp peak appears in the Raman shift ranging from about 490 to about 500 cm$^{-1}$ as illustrated in FIG. 1, which is different from that of conventional noncrystalline silicon. The crystalline silicon peak is similar to that of silicon particles having a size of less than about 1 nm, the peak of which appears at a Raman shift of less than about 500 cm$^{-1}$.

The structure of the silicon anode active material according to this embodiment does not significantly change during charging and discharging. In contrast, the structure of the noncrystalline silicon thin film significantly changes during charging and discharging, as illustrated in FIG. 3B (depicting a Raman spectrum of such a noncrystalline silicon thin film during charging and discharging). The peak in the Raman shift ranging from about 350 to about 400 cm$^{-1}$ indicates that a new structure is formed due to stress occurring during lithium charging and discharging. However, the structure of the crystalline silicon thin film according to this embodiment of the present invention does not significantly change, thus improving charge/discharge efficiency.

In one embodiment, RF-sputtering can be used to form the silicon thin film, but the deposition method is not limited thereto, and any method used to form thin films commonly known in the art, such as e-beam evaporation and ion-beam assisted deposition, can be used to form the silicon thin film.

The RF-sputtering of the anode active material may use a RF-power ranging from about 30 to about 90 watts, and an operating pressure of the chamber ranging from about 5 to about 20 mtorr. When the RF-power is less than about 30 watts, the kinetic energy of argon ions is too low to eject the target silicon atoms. When the RF-power is greater than about 90 watts, the surface of the deposited silicon is too rough. When the operating pressure of the chamber is less than about 5 mtorr, plasma in the chamber is unstable and the deposition cannot be properly performed. When the operating pressure of the chamber is greater than about 20 mtorr, the deposition rate is too slow.

In one embodiment, the thickness of the crystalline silicon thin film of the anode active material ranges from about 20 to about 500 nm. When the thickness of the silicon thin film is greater than about 500 nm, resistance and volume expansion is too great. When the thickness of the silicon thin film is less than about 20 nm, the silicon is not uniformly coated on the copper substrate.

According to another embodiment of the present invention, an anode is manufactured using the anode active material described above. The anode may be manufactured to have a thin film structure including a current collector and an anode active material layer on the current collector. A copper foil is commonly used as the current collector, and the current collector may have a thickness generally ranging from about 100 to about 300 nm.

The anode active material layer may be a silicon layer, and a metal layer may be laminated on the anode active material layer. The silicon layer may have a thickness ranging from about 20 to about 500 nm.

Any deposition method commonly used in the art can be used for the silicon deposition. For example, RF-sputtering may be used.

The method of manufacturing the anode is not limited to the above-described examples, and the anode may be manufactured by any suitable method.

Figure 5:
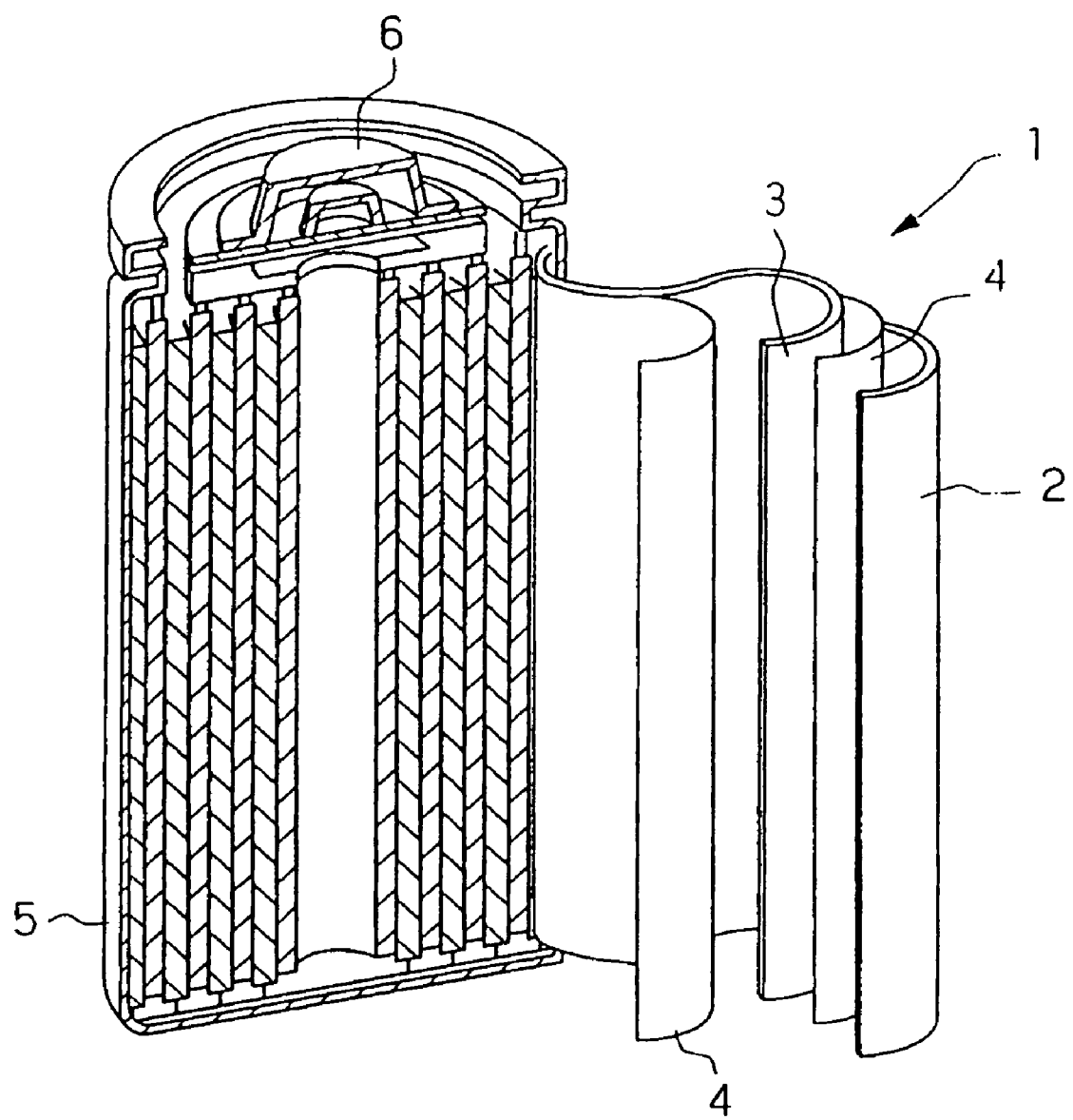
FIG. 5 is a schematic perspective view of a lithium battery according to one embodiment of the present invention.

According to another embodiment of the invention, a lithium battery includes the above-described anode. As shown in FIG. 5, the lithium battery 1 includes an electrode assembly including a cathode 2, an anode 3 and a separator 4 positioned between the cathode 2 and anode 3. The electrode assembly is placed inside a battery case 5 and sealed with a cap assembly 6 to complete the battery 1. The lithium battery can be manufactured as follows.

First, a cathode active material, a conducting agent, a binder and a solvent are mixed to prepare a cathode active material composition. The cathode active material composition is coated directly on a metal current collector and dried to prepare a cathode plate. Alternatively, the cathode active material composition is cast on a separate substrate to form a file, and the film is then separated from the substrate and laminated on a metal current collector to prepare a cathode plate. Lithium metal can also be used as the cathode.

The cathode active material can be any lithium containing metal oxide commonly used in the art. Nonlimiting examples of suitable lithium containing metal oxides include $LiCoO_2$, $LiMn_xO_{2x}$, $LiN_{x-1}Mn_xO_{2x}$ (x=1, 2), $Ni_{1-x-y}Co_xMn_yO_2$ ($0 \leq x \leq 0.5$, $0 \leq y \leq 0.5$), etc. In addition, the cathode active material may be a compound capable of inducing the oxidation and reduction of lithium such as $LiMn_2O_4$, $LiCoO_2$, $LiNiO_2$, $LiFeO_2$, $V_2O_5$, TiS and MoS.

One nonlimiting example of a suitable conducting agent is carbon black. Nonlimiting examples of suitable binders include vinylidenefluoride/hexafluoropropylene copolymers, polyvinylidenefluoride, polyacrylonitrile, polymethylmethacrylate, polytetrafluoroethylene and mixtures thereof. Styrene butadiene rubber polymers may also be used. Nonlimiting examples of suitable solvents include N-methylpyrrolidone, acetone, water, etc. The cathode active material, the conducting agent, the binder, and the solvent are used in amounts commonly used in lithium batteries.

Any separator commonly known in the field of lithium batteries may be used. In particular, the separator should have low resistance against ion transfer of the electrolyte and good electrolyte impregnation properties. For example, the separator may be made of a material selected from glass fiber, polyester, Teflon, polyethylene, polypropylene, polytetrafluoroethylene (PTFE), and combinations thereof. The separator may also be made of non-woven fabrics or woven fabrics. For example, in a lithium ion battery, a windable separator made of a material such as polyethylene or polypropylene may be used. On the other hand, in a lithium ion polymer battery, a separator that can be impregnated by an organic electrolyte solution may be used. According to one embodiment of the present invention, the separator may be manufactured using the following method.

A polymer resin, a filler, and a solvent are mixed to prepare a separator composition. Then, the separator composition is coated directly on an electrode and dried to form a separator film. Alternatively, the separator composition is cast on a separate support and dried to form a film, which film is then separated from the support and laminated on an electrode.

The polymer resin is not particularly limited and may be any material that can be used as a binder for an electrode plate. Nonlimiting examples of suitable polymer resins include vinylidenefluoride/hexafluoropropylene copolymers, polyvinylidenefluoride, polyacrylonitrile, polymethylmethacrylate, and mixtures thereof.

One exemplary electrolyte solution suitable for use with the present invention may be obtained by dissolving one or more lithium salt electrolytes in one or more solvents. Nonlimiting examples of suitable lithium salts include $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiSbF_6$, $LiAlO_4$, $LiAlCl_4$, $LiN(C_xF_{2x+1}SO_2)(C_yF_{2y+1}SO_2)$ (where x and y are natural numbers), LiCl, and LiI. Nonlimiting examples of suitable solvents include propylene carbonate, ethylene carbonate, diethyl carbonate, ethyl methyl carbonate, methyl propyl carbonate, butylene carbonate, benzonitrile, acetonitrile, tetrahydrofuran, 2-methyltetrahydrofuran, y-butyrolactone, dioxolane, 4-methyldioxolane, N,N-dimethylformamide, dimethylacetamide, dimethylsulfoxide, dioxane, 1,2-dimethoxyethane, sulfolane, dichloroethane, chlorobenzene, nitrobenzene dimethylcarbonate, methylethylcarbonate, diethylcarbonate, methylpropylcarbonate, methylisopropylcarbonate, ethylpropylcarbonate, dipropylcarbonate, dibutylcarbonate, diethyleneglycol, and dimethylether.

The separator is positioned between a cathode plate and an anode plate to form a battery structure. The battery structure is wound or folded and encased in a cylindrical battery case or a square battery case, and an organic electrolyte solution is then injected into the battery case to complete a lithium ion battery.

Battery structures may also be laminated to form a bi-cell structure and impregnated with an organic electrolyte solution. The resultant structure is encased in a pouch and sealed to complete a lithium ion polymer battery.

According to one embodiment of the present invention, a crystalline silicon thin film is formed on a substrate using RF-sputtering. The RF-sputtering uses RF-power ranging from about 50 to 70 watts, and an operating pressure of the chamber ranging from about 5 to about 20 mtorr.

Hereinafter, the present invention will be described with reference to the following examples. The following examples are presented for illustrative purposes only and are not intended to limit the scope of the invention.

Preparation of Anode Active Materials and Anodes

Example 1

Silicon was deposited on a copper substrate using a silicon target having a diameter of 2 inches to form a silicon thin film with a thickness of 150 nm, and a Cu(16 μm)/Si(150 nm) anode thin film was prepared. The initial vacuum pressure was set at less than $5 \times 10^{-3}$ torr in the deposition chamber, and then silicon was deposited under an argon atmosphere at $5 \times 10^{-3}$ torr at a flow rate of 10 seem and a RF-power of 50 watts to obtain the silicon thin film with a thickness of 150 nm.

Comparative Example 1

Silicon was deposited on a copper substrate using a silicon target having a diameter of 6 inches to form a silicon thin film with a thickness of 150 nm, and a Cu(16 μm)/Si(150 nm) anode thin film was prepared. During the deposition, the ion beam voltage was 600 V, and silicon was deposited under an argon atmosphere at 0.2 mtorr at a flow rate of 6 sccm and a RF-power of 400 watts to obtain the silicon thin film with a thickness of 150 nm.

Comparative Example 2

Crystalline silicon powder with an average particle diameter of 4 μm (High Purity Chemical Co., Ltd., Japan), graphite powder with an average particle diameter of 6 μm, and polyvinylidenedifluoride were mixed in a weight ratio of 3:6:1. The mixture was mixed with N-methyl pyrrolidone to prepare a slurry. The slurry was coated on Cu foil to a thickness of 16 μm, and then dried in a vacuum at 120° C. for 5 hours to prepare an electrode.

Evaluating the Properties of the Anodes

Evaluation Example 1

Measurement of Raman Spectra

A Raman spectrum of each of the silicon thin films according to Example 1 and Comparative Examples 1 and 2 was measured to analyze the structure of the silicon thin film and crystallinity was determined.

Raman spectrum analysis was performed using a 3D confocal Raman Microscopy System (Nanofinder 30, Tokyo Instruments, Inc). The analysis was performed using a diode laser beam with a wavelength of 488 nm using an objective lens of 100 magnifications. The silicon thin films were exposed for 5 seconds. The results are shown in FIG. 1 and Table 1 below.

TABLE 1

| | Raman shift | FWHM |
|---|---|---|
| Example 1 | 493.3 cm$^{-1}$ | 16.4 cm$^{-1}$ |
| Comparative Example 1 | 466.1 cm$^{-1}$ | 66.7 cm$^{-1}$ |
| Comparative Example 2 | 515.5 cm$^{-1}$ | 12.4 cm$^{-1}$ |

As illustrated in FIG. 1, a sharp peak was observed at a Raman shift between 490 to 500 cm$^{-1}$ in the silicon thin film of Example 1, a broad peak was observed at a Raman shift of around 480 cm$^{-1}$ in the silicon thin film of Comparative Example 1, and a sharp peak was observed at a Raman shift of around 520 cm$^{-1}$ in the silicon thin film of Comparative Example 2. The Raman shifts of Comparative Examples 1 and 2 were typical Raman shifts of noncrystalline silicon and polycrystalline silicon. Therefore, the silicon thin film of Example 1 can be considered to have a novel structure.

Evaluation Example 2

TEM Analysis

The silicon thin film prepared according to Example 1 and Comparative Example 1 was analyzed using a transmission electron microscope (FE-TEM (300 kV), ion-milling). The results are shown in FIGS. 2A and 2B.

Figure 2A:
FIG. 2A is a transmission electron microscope (TEM) image of the silicon thin film prepared according to Example 1.
Figure 2A:
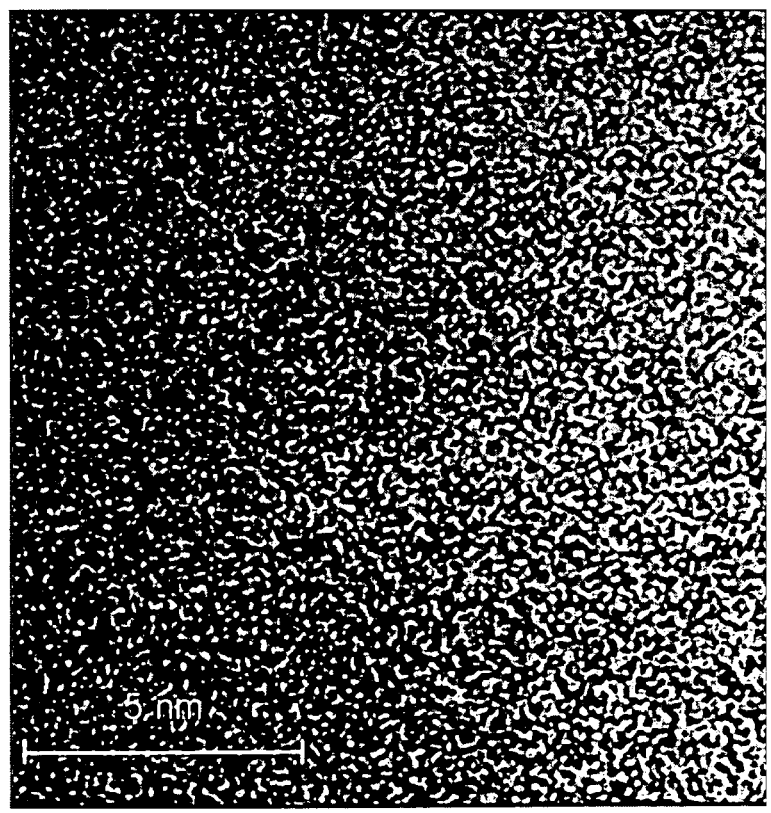
Figure 2B:
FIG. 2B is a TEM image of the silicon thin film prepared according to Comparative Example 1.
Figure 2B:
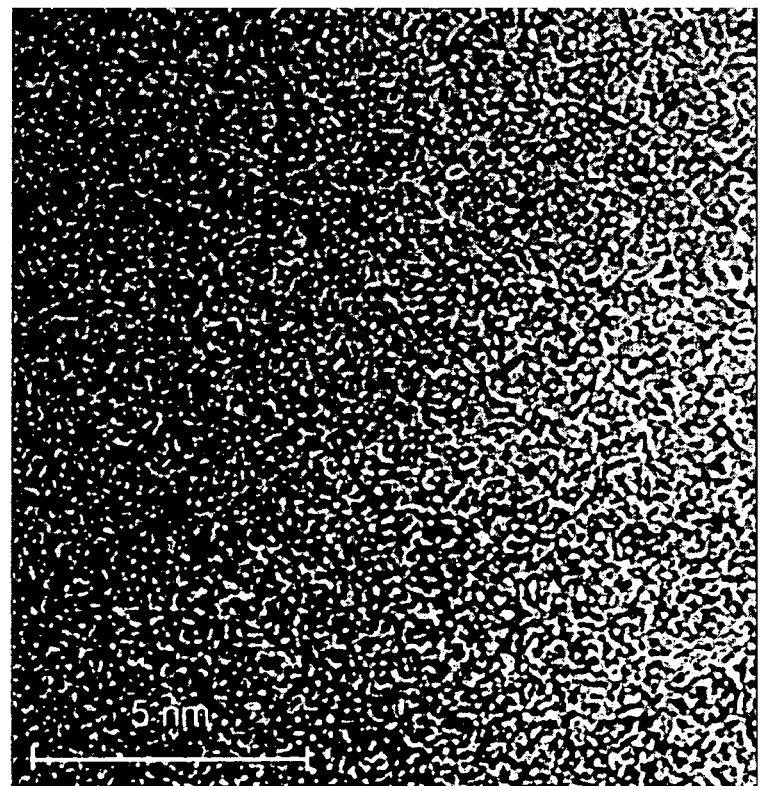

As illustrated in FIGS. 2A and 2B, there are no differences in the images of the silicon thin films of Example 1 and Comparative Example 1, and no Debye-Scherrer ring was observed in either of the silicon thin films. The silicon thin film of Comparative Example 1 was noncrystalline silicon since a Debye-Scherrer ring was not observed in the image. However, although a Debye-Scherrer ring was not observed in the silicon thin film of Example 1, the silicon thin film of Example 1 is not noncrystalline silicon since the Raman spectrum of Example 1 is different from that of Comparative Example 1. Accordingly, it can be concluded that the silicon thin film of Example 1 contains nano-sized crystals with a size of less than about 5 nm which the TEM cannot detect.

Manufacture of Lithium Batteries

Each of the anodes manufactured according to Example 1 and Comparative Examples 1 and 2 was used as an operating electrode, lithium metal foil was used as a reference electrode and counter electrode, and a solution of 1 M $LiPF_6$ dissolved in a mixed solvent of ethylene carbonate (EC) and diethyl carbonate (DEC) in, a volume ratio of 3:7 was used as an electrolyte solution to manufacture a beaker shaped triode cell.

Evaluation Example 3

Raman Spectrum Analysis during Charging and Discharging

A charge/discharge test of each of the cells manufactured above was performed at room temperature (25° C.). Each cell was charged at a constant current with a current density of 2100 mA/g. When the voltage of the cell reached 0.01 V, charging was performed under constant voltage until the final current density was 210 mA/g. Then, constant current discharging was performed under a constant discharging current density of 2100 mA/g until the voltage of the cell was 1.5 V. A Toscat 3000 (TOYO, Japan) was used as a charging and discharging device.

A Raman spectrum of each of the silicon thin films manufactured according to Example 1 and Comparative Example 1 was measured during charging and discharging, and the structural changes of the silicon thin film due to the charging and discharging was analyzed.

Silicon thin film samples of Example 1 and Comparative Example 1 were prepared for Raman spectrum analysis during charging and discharging as follows. Both sides of the silicon thin film samples were sealed with glass to protect against influences such as moisture, and the samples were measured using confocal technology. The samples were exposed for 5 seconds using an optical lens of 40 magnifications. The results are shown in FIGS. 3A and 3B.

Figure 3A:
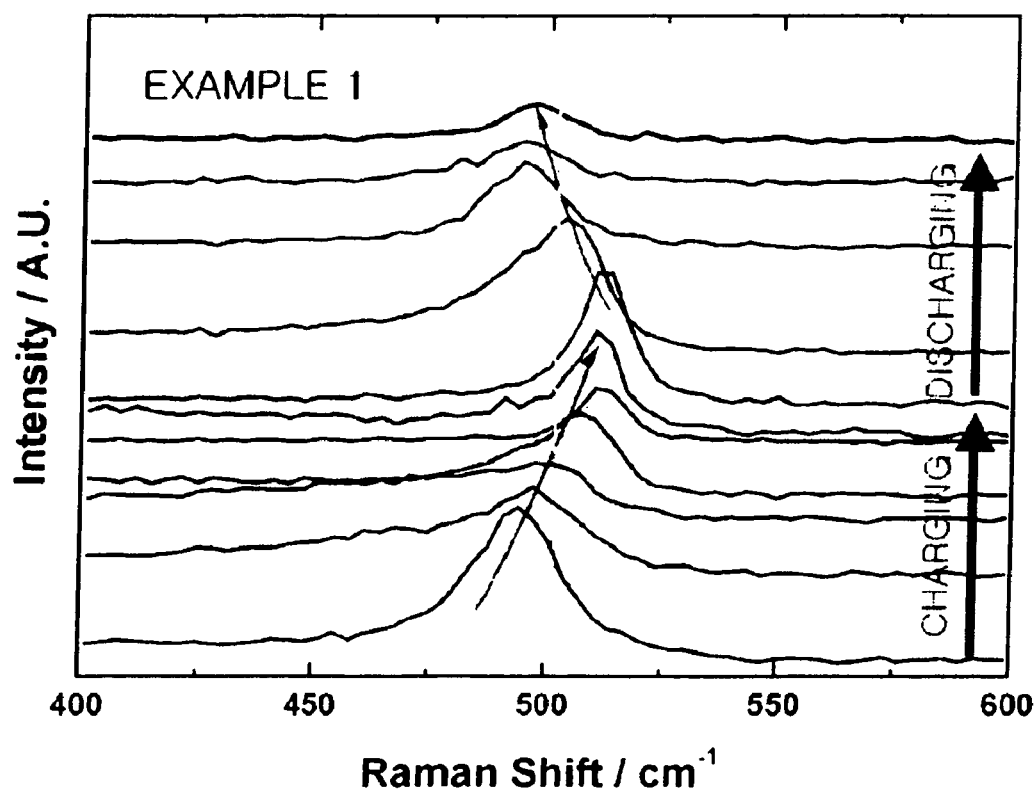
FIG. 3A is a Raman spectrum, taken after charging and discharging, of a silicon thin film prepared according to Example 1.
Figure 3B:
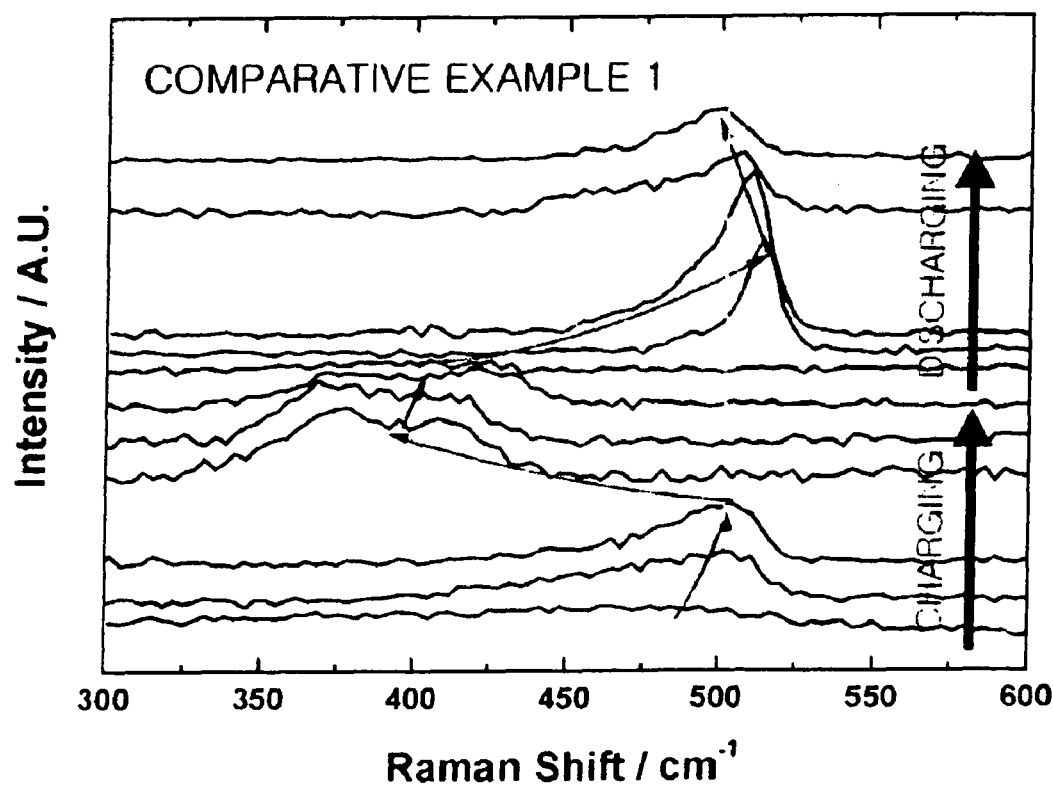
FIG. 3B is a Raman spectrum, taken after charging and discharging, of a silicon thin film prepared according to Comparative Example 1.

As illustrated in FIGS. 3A and 3B, a relatively small change in the structure of the silicon thin film of Example 1 during charging and discharging was observed. That is, the crystalline structure having a crystal size of less than 5 nm was transformed to a polycrystalline structure during charging, and the transformed structure returned to the original structure during discharging. On the other hand, the noncrystalline structure of the silicon thin film of Comparative Example 1 transformed to a new phase via a polycrystalline structure during charging and returned to the polycrystalline structure during discharging.

Therefore, the silicon thin film of Example 1 shows relatively insignificant changes in structure and reduced changes in volume, thus improving the charging and discharging efficiency of the battery.

Evaluation Example 4

Measurement of Discharge Capacity According to Charge/Discharge Cycles

Each manufactured cell was subjected to a charge/discharge test performed at room temperature (25° C.). Each cell was charged at constant current with a current density of 2100 mA/g. When the voltage of the cell reached 0.01 V, charging was performed under constant voltage until the final current density was 210 mA/g. On discharging, constant current discharging was performed under a constant discharging current density of 2100 mA/g until the voltage of the cell was 1.5 V. A Toscat 3000 (TOYO, Japan) was used as a charging and discharging device. The test results are shown in FIG. 4.

Figure 4:
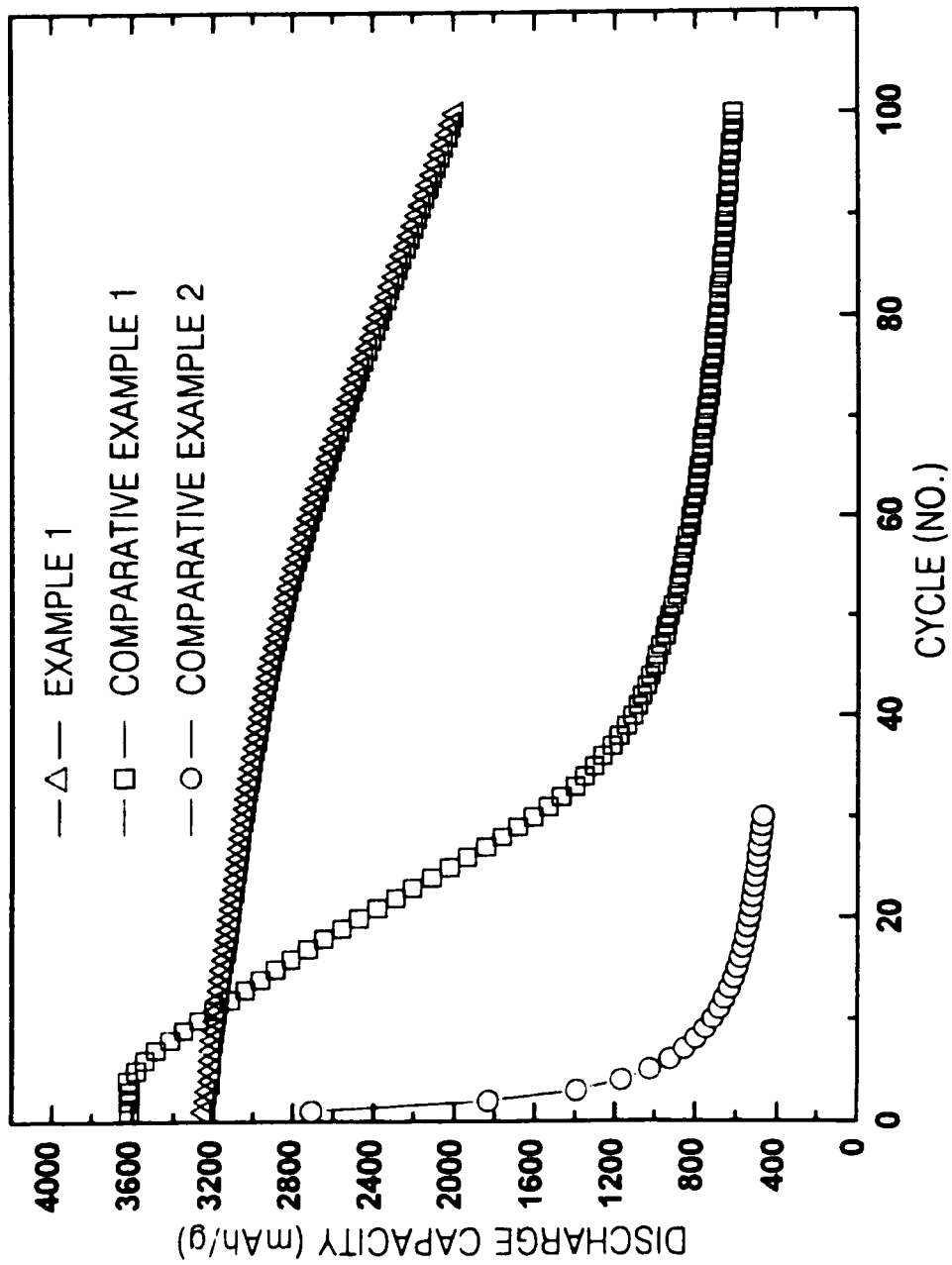
FIG. 4 is a graph illustrating the results of charging and discharging lithium batteries employing silicon thin films prepared according to Example 1 and Comparative Examples 1 and 2.

As illustrated in FIG. 4, the discharge retention rate of Example 1 is greater than that of Comparative Examples 1 and 2, indicating an improved cycle lifetime of Example 1.

The volume of the anode active material including the silicon thin film containing crystalline silicon according the present invention does not significantly change during charging and discharging. Thus lithium batteries employing the anode active material have excellent capacity retention rates and longer cycle lifetimes.

While certain exemplary embodiment of the present invention have been illustrated and described, it is understood by those of ordinary skill in the art that various changes and modifications to the described embodiments may be made without departing from the spirit and scope of the present invention as defined by the appended claims.

What is claimed is:

1. An anode active material for a lithium battery, the anode active material comprising a silicon thin film comprising crystalline silicon having a crystalline silicon Raman shift in a Raman spectrum ranging from about 490 to about 500 $cm^{-1}$ and a full width at half maximum (FWHM) of the crystalline silicon Raman shift ranging from about 10 to about 30 $cm^{-1}$.

2. The anode active material of claim 1, wherein the crystal size of the crystalline silicon is less than about 5 nm.

3. The anode active material of claim 1, wherein the silicon thin film comprises a radio frequency (RF) sputtered silicon thin film.

4. The anode active material of claim 3, wherein the RF sputtering uses RF-power ranging from about 30 to 90 watts, and an operating pressure ranging from about 5 to about 20 mtorr.

5. The anode active material of claim 1, wherein the thickness of the crystalline silicon thin film ranges from about 20 to about 500 nm.

6. An anode for a lithium battery, the anode comprising the anode active material of claim 1.

7. The anode of claim 6, wherein the crystal size of the crystalline silicon is less than about 5 nm.

8. The anode of claim 6, wherein the thickness of the crystalline silicon thin film ranges from about 20 to about 500 nm.

9. A lithium battery comprising:
a cathode;
the anode of claim 6; and
a separator.

10. The lithium battery of claim 9, wherein the crystal size of the crystalline silicon is less than about 5 nm.

11. The lithium battery of claim 9, wherein the thickness of the crystalline silicon thin film ranges from about 20 to about 500 nm.

12. A method of preparing an anode active material for a lithium battery, the method comprising RF-sputtering a crystalline silicon thin film on a substrate, wherein the crystalline silicon thin film comprises crystalline silicon having a crystalline silicon Raman shift in a Raman spectrum ranging from about 490 to about 500 $cm^{-1}$ and a full width at half maximum (FWHM) of the crystalline silicon Raman shift ranging from about 10 to about 30 $cm^{-1}$.

13. The method of claim 12, wherein the RF-sputtering uses RF-power ranging from about 30 to about 90 watts, and an operating pressure ranging from about 5 to about 20 mtorr.

* * * * *